United States Patent
Lung

(10) Patent No.: US 8,143,089 B2
(45) Date of Patent: Mar. 27, 2012

(54) SELF-ALIGN PLANERIZED BOTTOM ELECTRODE PHASE CHANGE MEMORY AND MANUFACTURING METHOD

(75) Inventor: Hsiang-Lan Lung, Dobbs Ferry, NY (US)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 12/899,991

(22) Filed: Oct. 7, 2010

(65) Prior Publication Data

US 2011/0017970 A1 Jan. 27, 2011

Related U.S. Application Data

(62) Division of application No. 11/351,296, filed on Feb. 9, 2006, now Pat. No. 7,825,396.

(60) Provisional application No. 60/757,933, filed on Jan. 11, 2006.

(51) Int. Cl.
*H01L 21/00* (2006.01)

(52) U.S. Cl. ............ 438/95; 438/381; 257/2; 257/3; 257/246; 257/248; 257/40; 257/E31.209

(58) Field of Classification Search .......... 438/95, 438/381; 257/2, 246, 248, 40, E31.029
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,719,594 A | 6/1987 | Pietraszek | |
| 4,876,220 A | 10/1989 | Mohsen et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,534,712 A | 7/1996 | Ovshinsky et al. | |
| 5,789,277 A | 8/1998 | Zahorik et al. | |
| 5,789,758 A | 8/1998 | Reinberg | |
| 5,814,527 A | 9/1998 | Wolstenholme et al. | |
| 5,831,276 A | 11/1998 | Gonzalez et al. | |
| 5,837,564 A | 11/1998 | Sandhu et al. | |

(Continued)

FOREIGN PATENT DOCUMENTS

WO 0079539 A1 12/2000

(Continued)

OTHER PUBLICATIONS

Adler, D. et al., "Threshold Switching in Chalcogenide-Glass Thin Films," J. Appl/Phys 51(6), Jun. 1980, pp. 3289-3309.

(Continued)

*Primary Examiner* — Bradley K Smith
*Assistant Examiner* — Mohammad T Karimy
(74) *Attorney, Agent, or Firm* — Haynes Beffel & Wolfeld LLP

(57) ABSTRACT

A method is described for self-aligning a bottom electrode in a phase change random access memory PCRAM device where a top electrode serves as a mask for self-aligning etching of the bottom electrode. The bottom electrode has a top surface that is planarized by chemical mechanical polishing. The top electrode also has a top surface that is planarized by chemical mechanical polishing. A bottom electrode layer like TiN is formed over a substrate and prior to the formation of a via during subsequent process steps. A first dielectric layer is formed over the bottom electrode layer, and a second dielectric layer is formed over the first dielectric layer. A via is formed at a selected section that extends through the first and second dielectric layers.

14 Claims, 16 Drawing Sheets

U.S. PATENT DOCUMENTS

| | | |
|---|---|---|
| 5,869,843 A | 2/1999 | Harshfield |
| 5,879,955 A | 3/1999 | Gonzalez et al. |
| 5,920,788 A | 7/1999 | Reinberg |
| 5,952,671 A | 9/1999 | Reinberg et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Lien |
| 6,031,287 A | 2/2000 | Harshfield |
| 6,034,882 A | 3/2000 | Johnson et al. |
| 6,077,729 A | 6/2000 | Harshfield |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 4/2001 | Le-Khac et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,314,014 B1 | 11/2001 | Lowrey et al. |
| 6,320,786 B1 | 11/2001 | Chang et al. |
| 6,339,544 B1 | 1/2002 | Chiang et al. |
| 6,351,406 B1 | 4/2002 | Kato et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,534,781 B2 | 3/2003 | Dennison |
| 6,545,903 B1 | 4/2003 | Wu |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,744,088 B1 | 6/2004 | Dennison |
| 5,687,112 A1 | 9/2004 | Spitzer |
| 6,791,102 B2 | 9/2004 | Johnson et al. |
| 6,797,979 B2 | 10/2004 | Ohashi |
| 6,800,563 B2 | 10/2004 | Xu |
| 6,815,704 B1 | 11/2004 | Chen |
| 6,864,500 B2 | 3/2005 | Gilton |
| 6,864,503 B2 | 3/2005 | Lung |
| 6,867,638 B2 | 3/2005 | Saiki et al. |
| 6,888,750 B2 | 5/2005 | Walker et al. |
| 6,894,305 B2 | 5/2005 | Yi et al. |
| 6,927,410 B2 | 8/2005 | Chen |
| 6,933,516 B2 | 8/2005 | Xu |
| 6,936,840 B2 | 8/2005 | Sun et al. |
| 6,937,507 B2 | 8/2005 | Chen |
| 4,599,705 A1 | 9/2005 | Cho |
| 6,992,932 B2 | 1/2006 | Cohen |
| 7,037,749 B2 | 5/2006 | Horii et al. |
| 6,861,267 B2 | 2/2007 | Segal et al. |
| 2004/0248339 A1 | 12/2004 | Lung |
| 2005/0018526 A1 | 1/2005 | Lee |
| 2005/0019975 A1 | 1/2005 | Lee et al. |
| 2005/0215009 A1 | 9/2005 | Cho |
| 2006/0038221 A1 | 2/2006 | Lee et al. |
| 2006/0192193 A1 | 8/2006 | Lee et al. |
| 2007/0166981 A1 | 7/2007 | Furukawa et al. |
| 2008/0054244 A1 | 3/2008 | Lee et al. |

FOREIGN PATENT DOCUMENTS

| | | |
|---|---|---|
| WO | 0145108 A1 | 6/2001 |

OTHER PUBLICATIONS

Adler, David, "Amorphous-Semiconductor Devices," Sci. Amer., vol. 236, pp. 36-48, May 1977.

Ahn, S. J. et al., "A Highly Manufacturable High Density Phase Change Memory of 64 Mb and Beyond," IEEE IEDM Dec. 13-15, 2004, pp. 907-910.

Axon Technologies Corporation paper: Technology Description, published at least as early as Dec. 1997, pp. 1-6.

Bedeschi, F. et al., "4-MB MOSFET-Selected Phase-Change Memory Experimental Chip," IEEE, Sep. 21-23, 2004, 4 PP.

Blake thesis, "Investigation of GeTeSb5 Chalcogenide Films for Use as an Analog Memory," AFIT/GE/ENG/00M-04, Mar. 2000, 121 pages.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," Jun. 14-16, 2005 Symposium on VLSI Technology Digest of Technical Papers, pp. 96-97.

Gill, Manzur et al., "A High-Performance Nonvolatile Memory Technology for Stand-Alone Memory and Embedded Applications," Feb. 3-7, 2002 IEEE-ISSCC Technical Digest (TD 12.4), 7 pp.

Ha, Y. H. et al., "An Edge Contact Type Cell for Phase Change RAM Featuring Very Low Power Consumption," Jun. 10-12, 2003 Symposium on VLSI Technology Digest of Technical Papers, pp. 175-176.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.

Horii, H. et al., "A Novel Cell Technology Using N-doped GeSbTe Films for Phase Change RAM," Jun. 10-12, 2003 Symposium on VLSI Technology Digest of Technical Papers, pp. 177-178.

Hwang, Y. N. et al., "Full Integration and Reliability Evaluation of Phase-change RAM Based on 0.24um-CMOS Technologies," Jun. 10-12, 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, Apr. 17-21, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM Dec. 13-15, 2004, 4 pp.

Lai, Stefan, "Current Status of the Phase Change Memory and Its Future," IEEE IEDM Dec. 10, 2003, pp. 255-258.

Lai, Stephan et al., "OUM-A 180 nm Nonvolatile Memory Cell Element Technology for Stand Alone and Embedded Applications," IEEE IEDM Dec. 2-5, 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase -Change Memory Cell for Embedded and Stand-Alone Non-Volatile Memory Applications," Jun. 15-17, 2004 Symposium on VLSI Technology Digest of Technical Papers, pp. 18-19.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Rochefort, C. et al., "Manufacturing of High Aspect-Ration p-n Junctions Using Vapor Phase Doping for Application in Multi-Resurf Devices," IEEE Jun. 4-7, 2002, pp. 237-240.

Strauss, Karl F. et al., "Overview of Radiation Tolerant Unlimited Write Cycle Non-Volatile Memory," IEEE Mar. 18-25, 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era-vol. 4, pp. 674-679, 2004.

Yi, J. H. et al., "Novel Cell Structure of PRAM with Thin Metal Layer Inserted GeSbTe," IEEE IEDM Dec. 10, 2003, 4 pages.

Yonehara, T. et al., "Control of Grain Boundary Location by Selective Nucleation Over Amorphous Substrates, " Mat. Res. Soc. Symp. Proc., vol. 106, 1998, pp. 21-26.

SELF-ALIGN PLANERIZED BOTTOM ELECTRODE PHASE CHANGE MEMORY AND MANUFACTURING METHOD

RELATED APPLICATION DATA

This application is a divisional of U.S. patent application Ser. No. 11/351,296 filed on 9 Feb. 2006, which application claims the benefit under 35 U.S.C. §119(e) of U.S. Provisional Patent Application No. 60/757,933, filed 11 Jan. 2006.

PARTIES TO A JOINT RESEARCH AGREEMENT

International Business Machines Corporation, a New York corporation; Macronix International Corporation, Ltd., a Taiwan corporation, and Infineon Technologies A.G., a German corporation, are parties to a Joint Research Agreement.

BACKGROUND OF THE INVENTION

1. Field of the Invention

The present invention relates to high density memory devices based on phase change based memory materials, including chalcogenide based materials and other materials, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

Problems have arisen in manufacturing such devices with very small dimensions, and with variations in process that meet tight specifications needed for large-scale memory devices. It is desirable therefore to provide a memory cell structure having small dimensions and low reset currents, and a method for manufacturing such structure that meets tight process variation specifications needed for large-scale memory devices. In a prior solution, a memory device is manufactured where TiN deposition on sidewalls could cause a short to occur between a top electrode and a bottom electrode. It is further desirable to provide a manufacturing process and a structure, which are compatible with manufacturing of peripheral circuits on the same integrated circuit while overcoming the potential short between the top and bottom electrodes.

SUMMARY OF THE INVENTION

The present invention describes a method for aligning a bottom electrode member in a phase change random access memory PCRAM device where a top electrode member serves as a mask for self-align etching of the bottom electrode member. The sides of the bottom electrode member are in alignment with the sides of the top electrode member. The bottom electrode has a top surface that is planarized by chemical mechanical polishing. The top electrode also has a top surface that is planarized by chemical mechanical polishing. A bottom electrode layer like TiN is formed over a substrate prior to the formation of a via during subsequent process steps. A first dielectric layer is formed over the bottom electrode layer, and a second dielectric layer is formed over the first dielectric layer. A via is formed at a selected section that extends through the first and second dielectric layers. A wet etching causes the length in a first segment in the second dielectric layer to be longer than the length in a first segment in the first dielectric layer. When a low thermal material is deposited into the via with anisotropic etching, a void in the via creates a pore. The top and bottom electrodes are electrically coupled through a phase change material that is deposited into the pore and the via extending between a top surface of the bottom electrode and a bottom surface of the top electrode.

Broadly stated, a memory device comprises a substrate body having contact plugs and a top surface. A first electrode member overlies the top surface of the substrate body in which a bottom surface of the first electrode contacting one of the contact plugs. The first electrode has a substantially planar top surface. A low conductivity spacer material on the first electrode member defines a pore that extends to the electrode surface of the first electrode. A programmable resistive memory material within the pore is electrically coupled to the electrode surface of the first electrode. A second electrode member has a top surface and an electrode surface in contact with the programmable resistive material where the first and second electrode members have respective sides and where the sides of the second electrode member are in alignment with the sides of the first electrode member.

Advantageously, the present invention provides a phase change memory where the planarized bottom electrode is self-aligned.

The structures and methods regarding to the present invention are disclosed in the detailed description below. This summary does not purport to define the invention. The invention is defined by the claims. These and other embodiments, features, aspects, and advantages of the invention will become better understood with regard to the following description, appended claims and accompanying drawings.

BRIEF DESCRIPTION OF THE DRAWINGS

The invention will be described with respect to specific embodiments thereof, and reference will be made to the drawings, in which.

DETAILED DESCRIPTION

A description of embodiments of the present invention is provided with reference to FIGS. 1-14.

Figure 1:
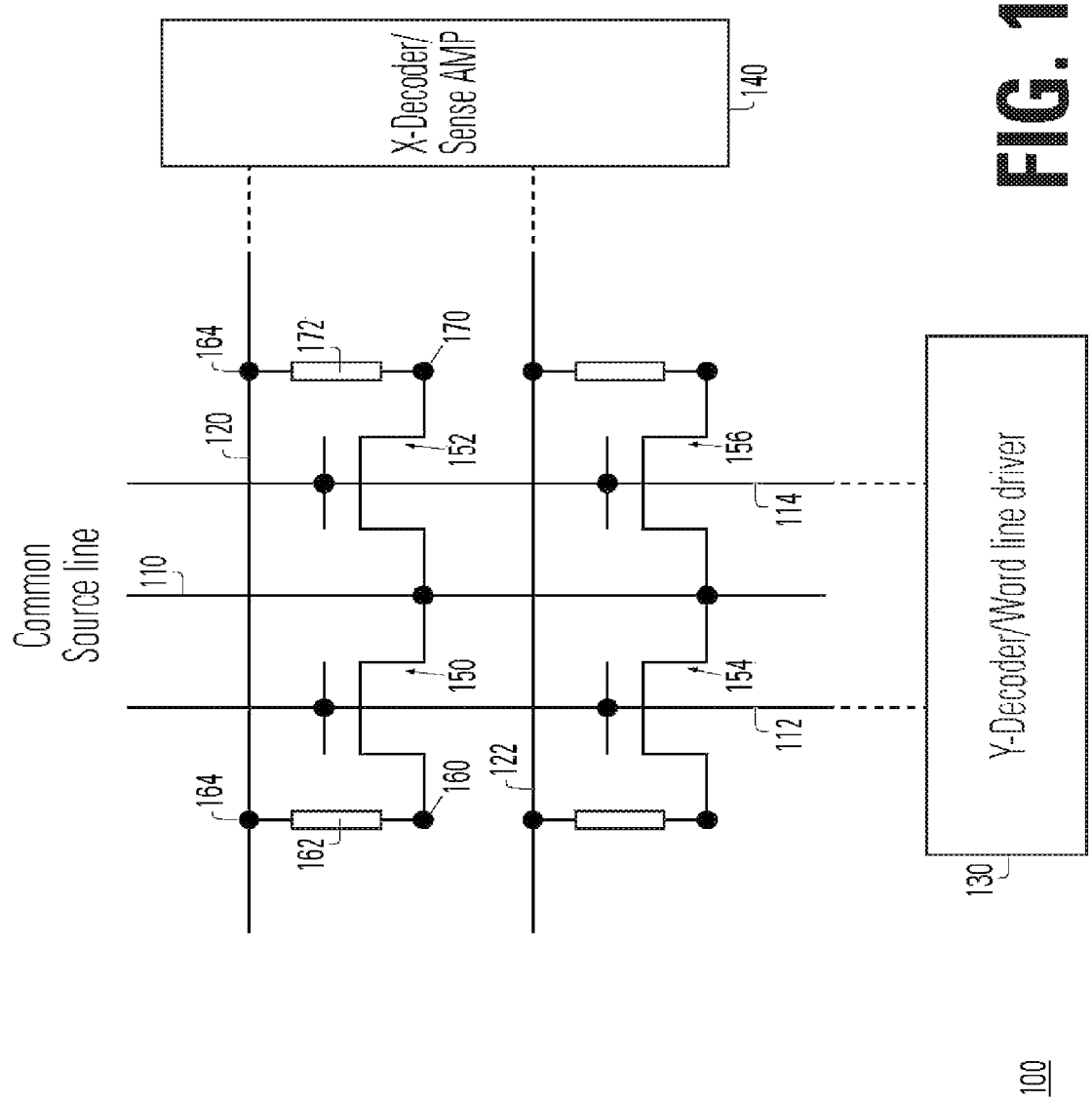
FIG. 1 is a schematic diagram illustrating a memory array comprising phase change memory elements in accordance with the present invention.

Referring now to FIG. 1, there is shown a structure illustrating a memory array 100 comprising phase change memory elements. A common source line 110, a word line 112 and a word line 114 are arranged generally parallel in the Y-direction. Bit lines 120 and 122 are arranged generally parallel in the X-direction. A Y-decoder and a word line driver in block 139 are coupled to the word lines 112, 114. An X-decoder and a set of sense amplifiers in block 140 are coupled to the bit lines 120 and 122. The common source line 110 is coupled to the source terminals of access transistors 150, 152, 154 and 156. The gate of access transistor 150 is coupled to the word line 112. The gate of access transistor 152 is coupled to the word line 114. The gate of access transistor 154 is coupled to the word line 112. The gate of access transistor 156 is coupled to the word line 114. The drain of access transistor 150 is coupled to the electrode member 160 for memory element 162, which in turn is coupled to electrode member 164. Likewise, the drain of access transistor 152 is coupled to the electrode member 170 for memory element 172, which is in turn coupled to the electrode member 164. The electrode members 164 and 164 are coupled to the bit line 120. For schematic purposes, the electrode member 164 is illustrated at separate locations on the bit line 120. It will be appreciated that separate electrode members can be utilized for the separate memory element in other embodiments. Access transistors 154 and 156 are coupled to corresponding memory cells as well on line 122. It can be seen that the common source line 110 is shared by two rows of memory cells, where a row is arranged in the Y-direction in the illustrated schematic. Likewise, the electrode member 164 is shared by two memory cells in a column in the array, where a column is arranged in the X-direction in the illustrated schematic.

Figure 2:
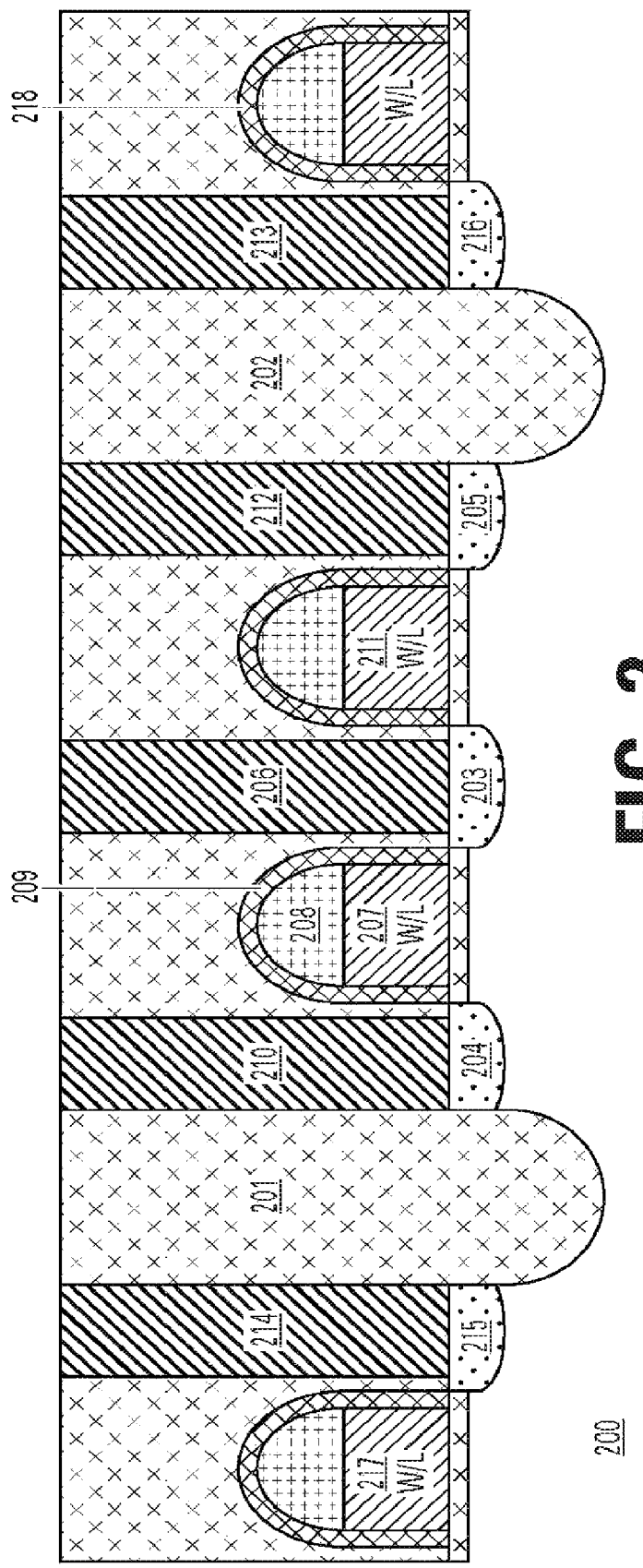
FIG. 2 is process diagram illustrating a structure after front-end-of-line processing of a substrate for forming standard CMOS components in the illustrated embodiment corresponding to the word lines, the source line, and the access transistors in the memory array as shown in FIG. 1.

As shown in FIG. 2, there is a structure 200 after front-end-of-line processing of a substrate body for forming the standard CMOS components in the illustrated embodiment corresponding to the word lines, the source line, and the access transistors in the memory array 100 as shown in FIG. 1. A source line 206 overlies a doped region 203 in the semiconductor substrate, where the doped region 203 corresponds with the source terminal of a first access transistor on the left in FIG. 2, and a second access transistor on the right in FIG. 2. In this embodiment, the source line 206 extends to the top surface of the structure 200. In other embodiments the source line does not extend all the way to the surface. A doped region 204 corresponds with the drain terminal of the first access transistor. A word line including a polysilicon 207, and a silicide cap 208, acts as the gate of the first access transistor. A dielectric layer 209 overlies the polysilicon 207 and the silicide cap 208. A plug 210 contacts doped region 204, and provides a conductive path to the surface of the structure 200 for contact to a memory cell electrode as described below. The drain terminal of the second access transistor is provided by a doped region 205. A word line including a polysilicon line 211, and a silicide cap (not labeled) acts as the gate for the second access transistor. A plug 212 contacts doped region 205 and provides a conductive path to the top surface of the structure 200 for contact to a memory cell electrode as described below. Isolation trenches 201 and 202 separate the two-transistor structure coupled to the plugs 210 and 212, from adjacent two-transistor structures. On the left, word line polysilicon 217 and plug 214 are shown. On the right, a word line polysilicon 218 and a plug 213 are shown.

Figure 3:
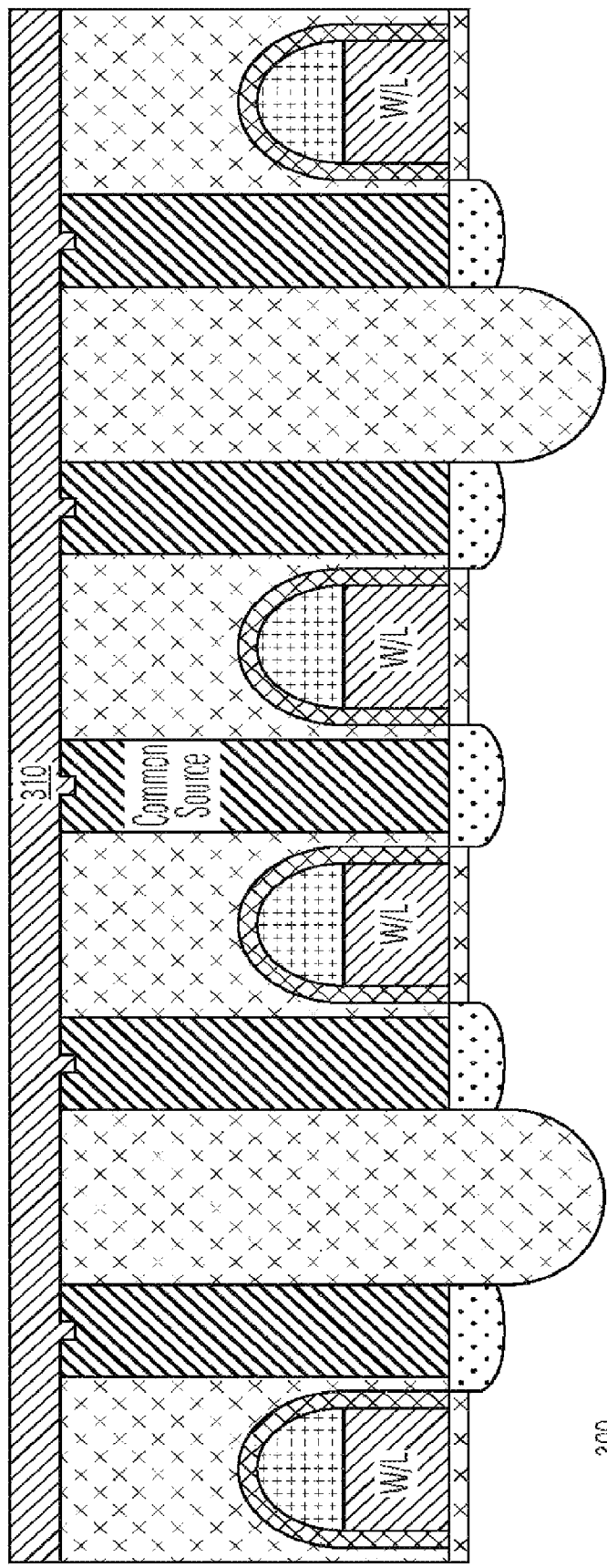
FIG. 3 is a process diagram illustrating a first step in performing titanium nitride deposition and chemical mechanical polishing in accordance with the present invention.

In FIG. 3, there is shown a process diagram 300 illustrating a first step in performing titanium nitride deposition and chemical mechanical polishing (CMP). A relatively thin conductive electrode layer 310 comprising a conductive electrode material such as titanium nitride TiN is formed on the surface of the structure 200. An example of suitable thickness of the conductive electrode layer 310 ranges from about 20 to about 60 nm after CMP polishing. The titanium nitride layer 310 fills irregularities on the surface of the plugs, and provides a planar surface for further processing.

Figure 4A:
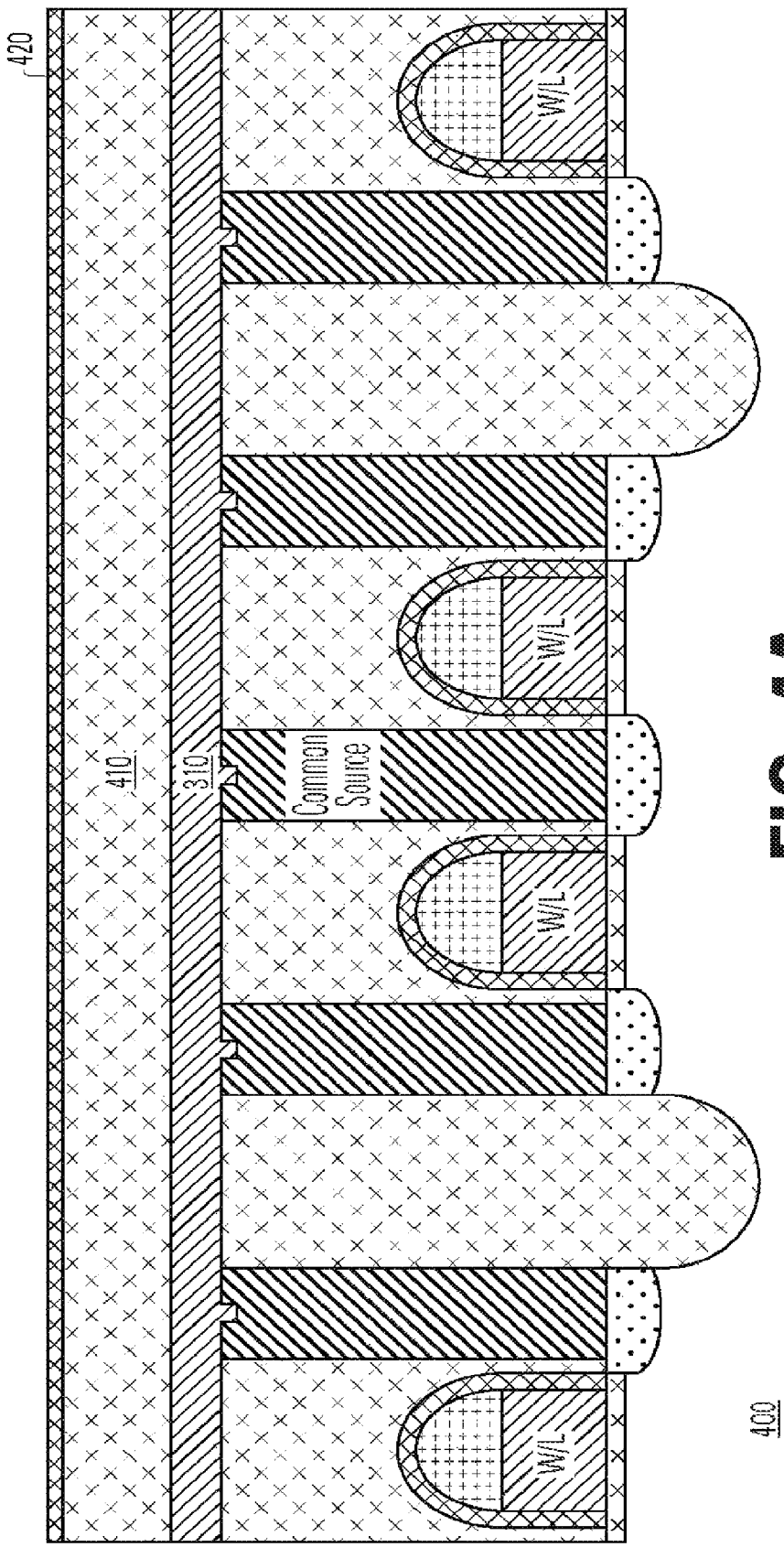
FIG. 4A is a process diagram illustrating a second step in carrying out oxide and silicon nitride deposition in accordance with the present invention.
Figure 4B:
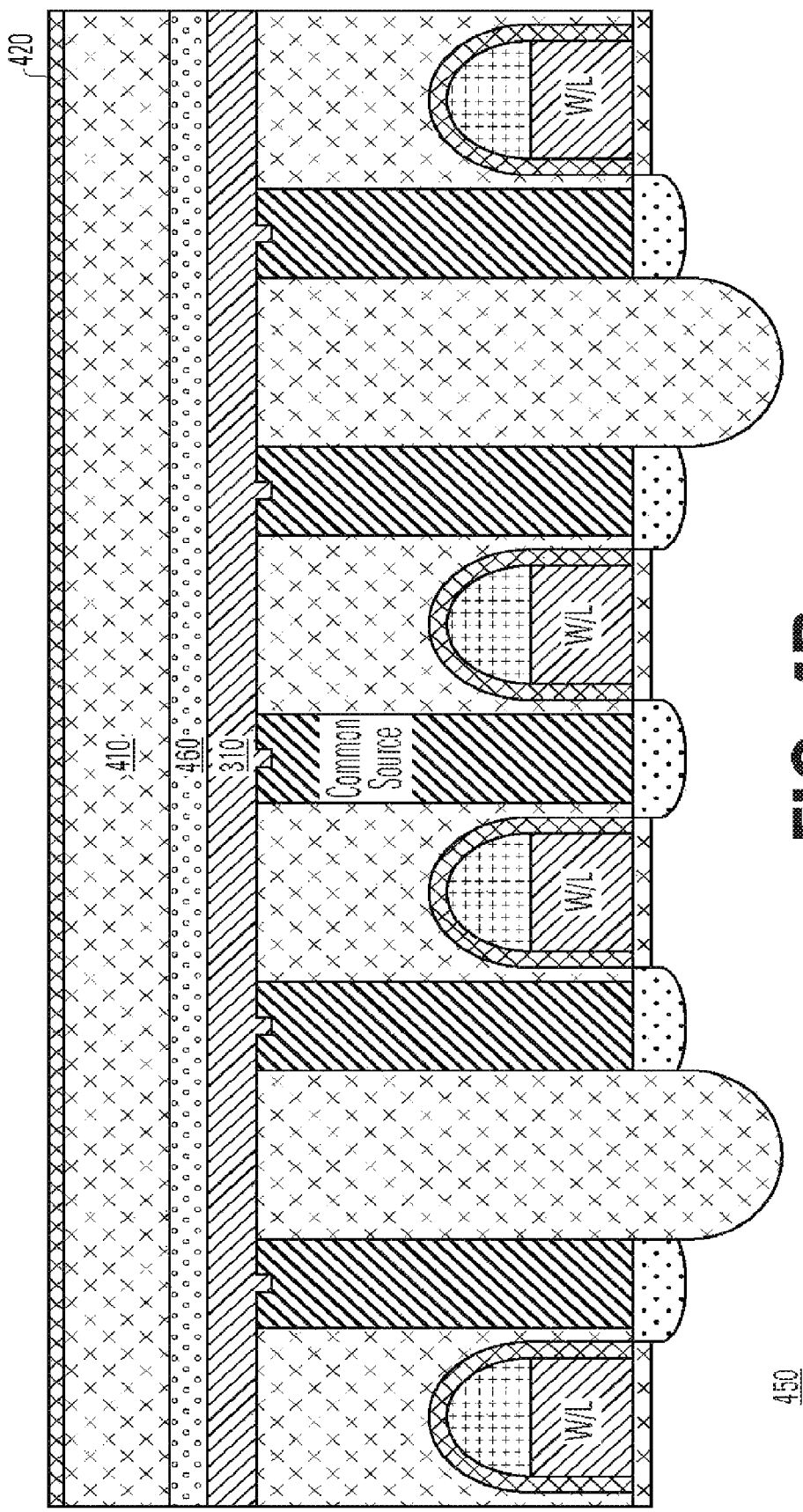
FIG. 4B is a process diagram illustrating an alternative embodiment in the second step in carrying out the deposition of a memory material layer, an oxide layer and a silicon nitride layer in accordance with the present invention.

FIG. 4A illustrates a process diagram 400 in a next stage in the manufacturing process for this example. A first dielectric layer 410, such as silicon dioxide, is deposited overlying the conductive layer 310. A second dielectric layer 420 comprising silicon nitride or other suitable material is formed over the first dielectric layer 410. In one embodiment, the second dielectric layer 420 comprises a thin silicon nitride layer. In an alternative embodiment as shown in a process diagram 450 in FIG. 4B, a memory material layer 460 is deposited over the conductive layer 310 followed by a deposition of the first dielectric layer 410 and the second dielectric layer 420.

Figure 5:
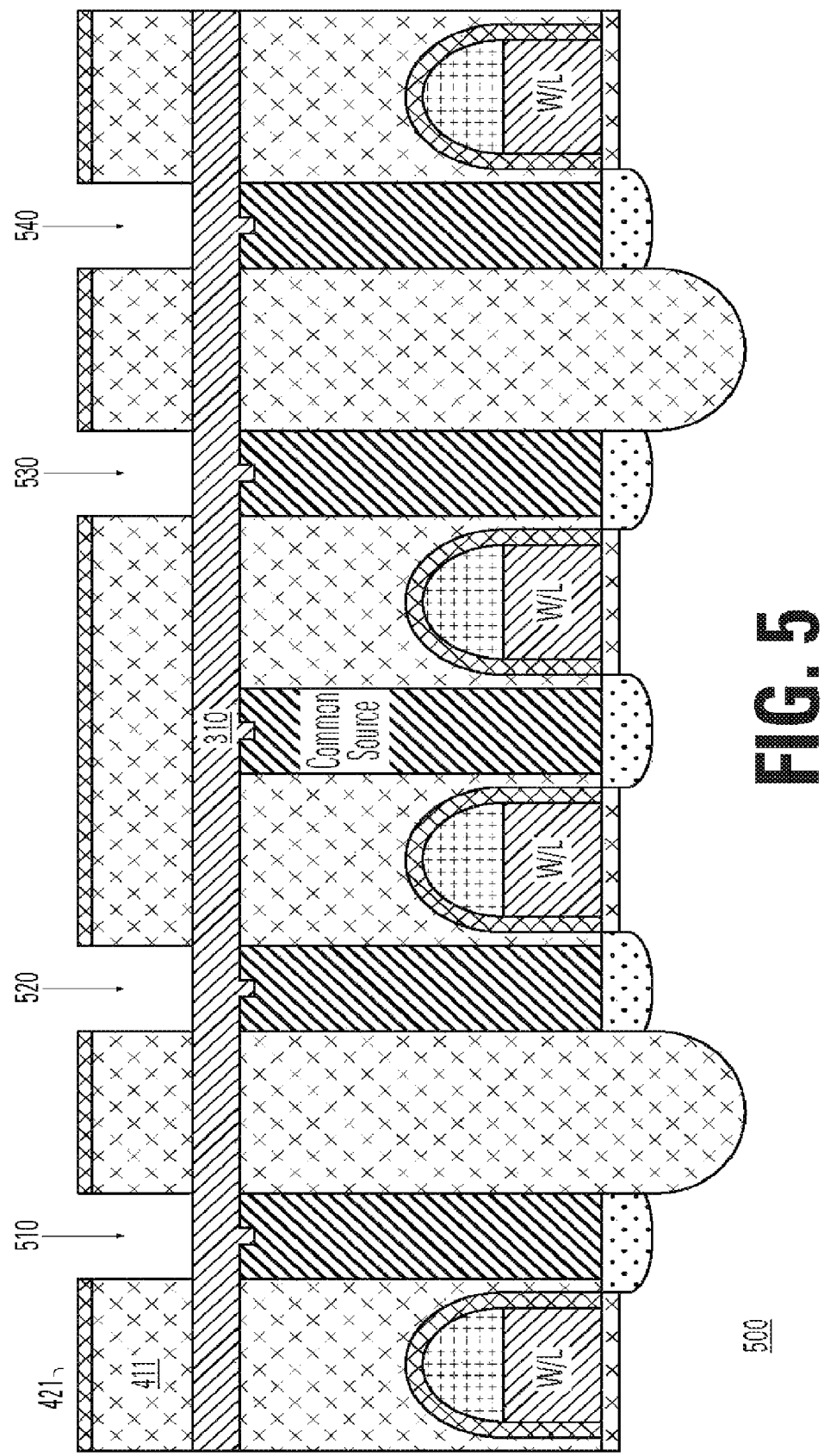
FIG. 5 is a process diagram illustrating a third step in opening a plurality of vias in accordance with the present invention.

Turning now to FIG. 5, there is a process diagram 500 showing a next stage in the process, in which a via 510 is etched selectively through the second dielectric layer 420 and the first dielectric layer 410 to the conductive electrode material 310, creating a first segment 421 from the second dielectric layer 420 overlying a first segment 411 from the first dielectric layer 410.

Figure 6:
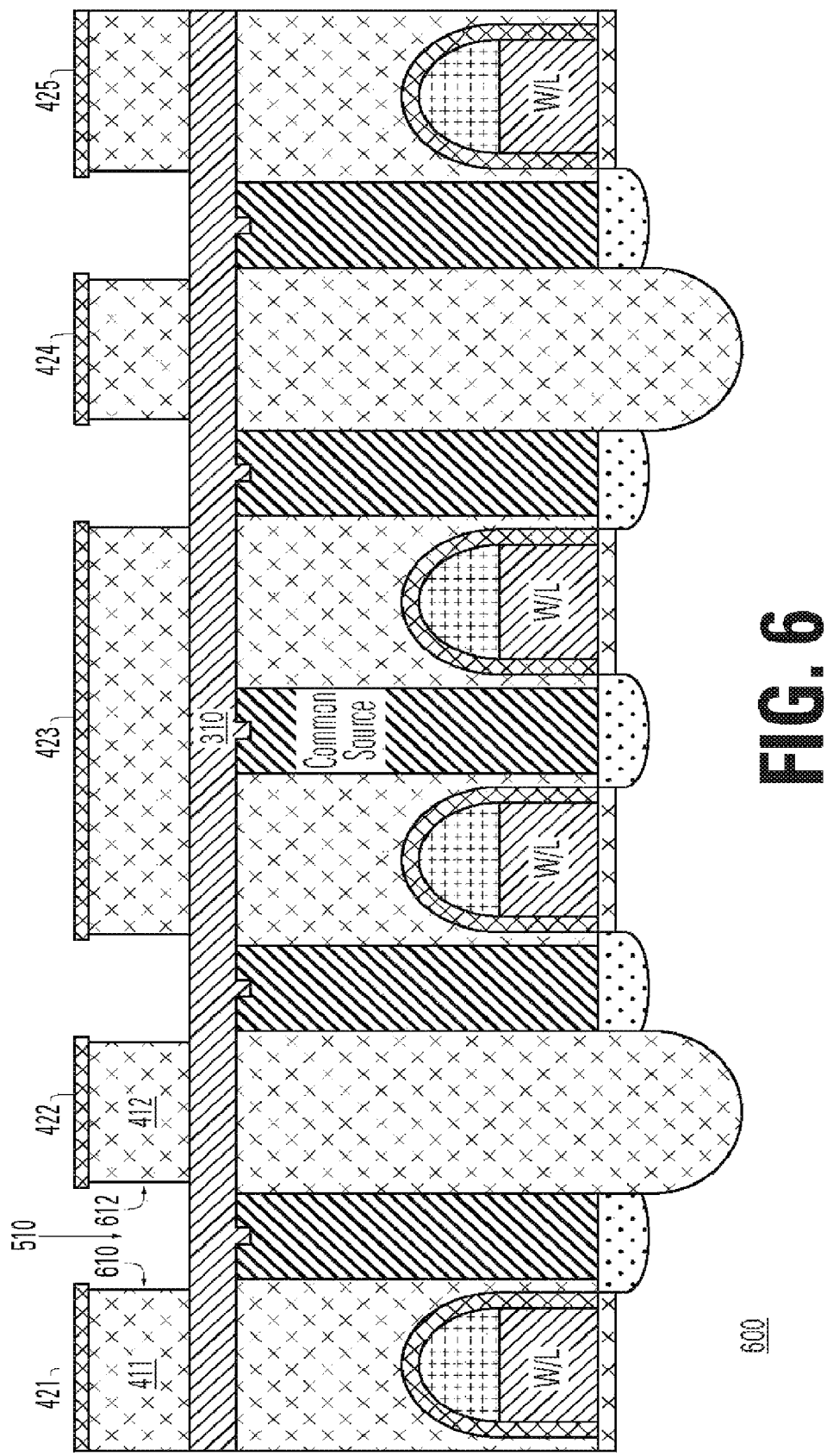
FIG. 6 is a process diagram illustrating a fourth step in performing wet oxide etching in accordance with the present invention

As illustrated in FIG. 6, there is shown a process diagram 600 illustrating a fourth step in performing wet oxide etching of segments in the first dielectric layer 410. The wet oxide etching is conducted in the via opening 510 that affects both sidewalls with a particular via. In the via opening 510, a sidewall 610 of first segment 411 from the first dielectric layer 410 is etched so that the first segment 421 from the second dielectric layer 420 protrudes over the sidewall 610 of the first segment 411 from the first dielectric layer 410. The first segment 421 from the second dielectric layer 420 overhangs the first segment 411 from the first dielectric layer 410. A sidewall 612 of second segment 412 from the first dielectric layer 410 is etched so that the left side of the second segment 422 from the second dielectric layer 420 protrudes over the sidewall 612 of the second segment 412 from the first dielectric layer 410. The left edge of the second segment 422 from the second dielectric layer 420 overhangs the second segment 412 from the first dielectric layer 410.

Figure 7:
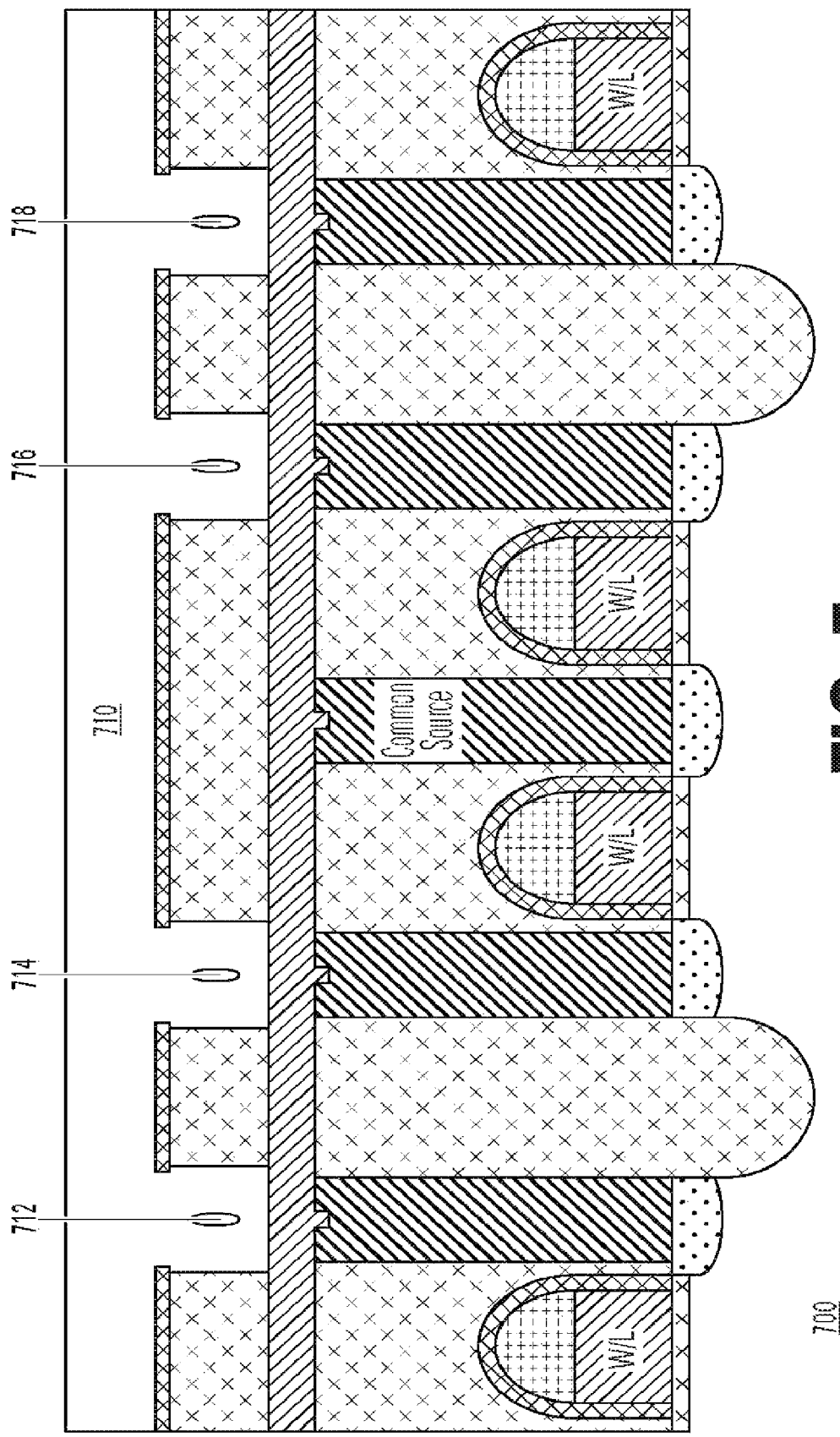
FIG. 7 is a process diagram illustrating a fifth step in carrying out a low thermal conductivity material deposition in accordance with the present invention.

In FIG. 7, there is shown a process diagram 700 illustrating a fifth step in carrying out a low thermal conductivity material deposition. A fill 710 that possesses both low thermal conductivity and low electrical conductivity characteristics is deposited by chemical vapor deposition (CVD) to achieve good conformity into the vias 510, 520, 530 and 540 with voids 712, 714, 716 and 718 and on top of the second dielectric layer 420. In this embodiment, one property of the fill 710 possesses a low thermal conductivity lower than the thermal conductivity of surrounding dielectric layer materials in the first dielectric layer 410. Another property of the fill 710 possesses an electrical conductivity lower than that of a phase change material 910 as described in FIG. 9. Some suitable examples of low electrical conductivity and low thermal conductivity materials are described as follows. The fill 710 may include silicon oxide, silicon oxynitride, silicon nitride, $Al_2O_3$, other low K (low permittivity) dielectrics, or an ONO or SONO multi-layer structure. The term "low K" means low permittivity. Alternatively, the fill may comprise an electrical insulator including one or more elements selected from the group consisting of Si, F, N, O, and C. In devices in which the dielectric layer 410 comprises silicon dioxide, the fill has a thermal conductivity less than that of silicon dioxide which is about 0.014 J/cm*K*sec. In other preferred embodiments, the thermal insulator has a thermal conductivity less than that of the amorphous state of the phase change material, or less than about 0.003 J/cm*K*sec for a phase change material comprising GST. Representative thermally insulating materials include materials that are a combination of the elements silicon Si, carbon C, oxygen O, fluorine F, and hydrogen H. Examples of thermally insulating materials which are candidates for use for the thermally insulating fill layer include $SiO_2$, SiCOH, polyimide, polyamide, and fluorocarbon polymers. Other examples of materials which are candidates for use for the thermally insulating fill layer include fluorinated $SiO_2$, silsesquioxane, polyarylene ethers, parylene, fluoropolymers, fluorinated amorphous carbon, diamond like carbon, porous silica, mesoporous silica, porous silsesquioxane, porous polyimide, and porous polyarylene ethers. A single layer or combination of layers within the pipe can provide thermal and electrical insulation.

Figure 8:
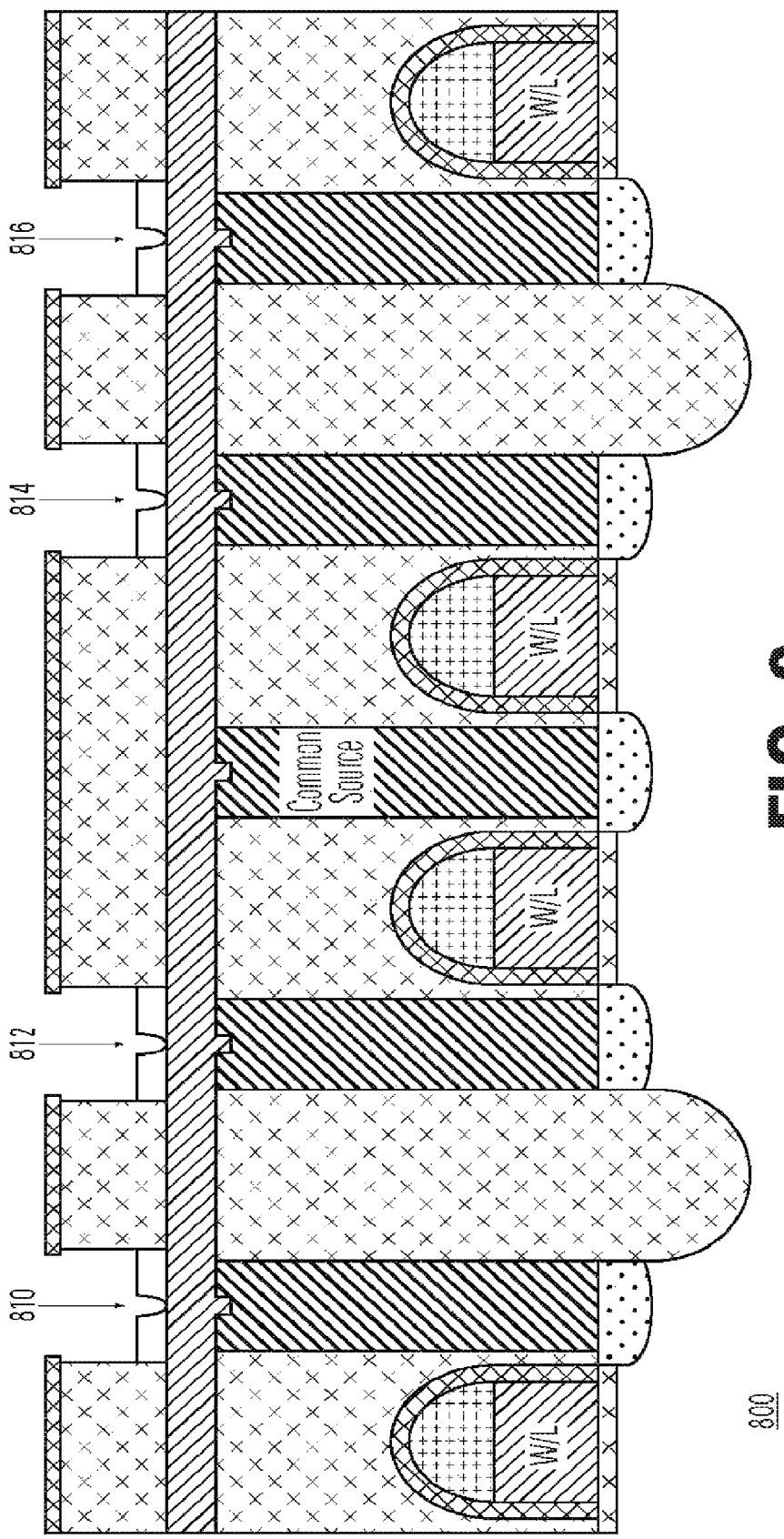
FIG. 8 is a process diagram illustrating a sixth step in thermal and electrical insulator spacer etching in accordance with the present invention.

Turning now FIG. 8, there is shown a process diagram 800 illustrating a sixth step in spacer etching to create pores 810, 812, 814 and 816 respectively from voids 712, 714, 716 and 718. In this embodiment, the spacer etching extends into the fill 710 and voids 712, 714, 716 and 718 so that pores 810, 812, 814 and 816 are created in which the bottom of each pore couples with the bottom electrode layer 310. In one embodiment, the pore has a small width and a small length. For example, the width of the pore can be selected to be about 30 to 80 nm. In one embodiment, the pore is selected to be about 60 nm. Other width and length dimensions can also be selected for use with the present invention. Spacer etching extends through a substantial portion of the fill 710 until reaching the pores 810, 812, 814 and 816 as shown in FIG. 8.

Figure 9:
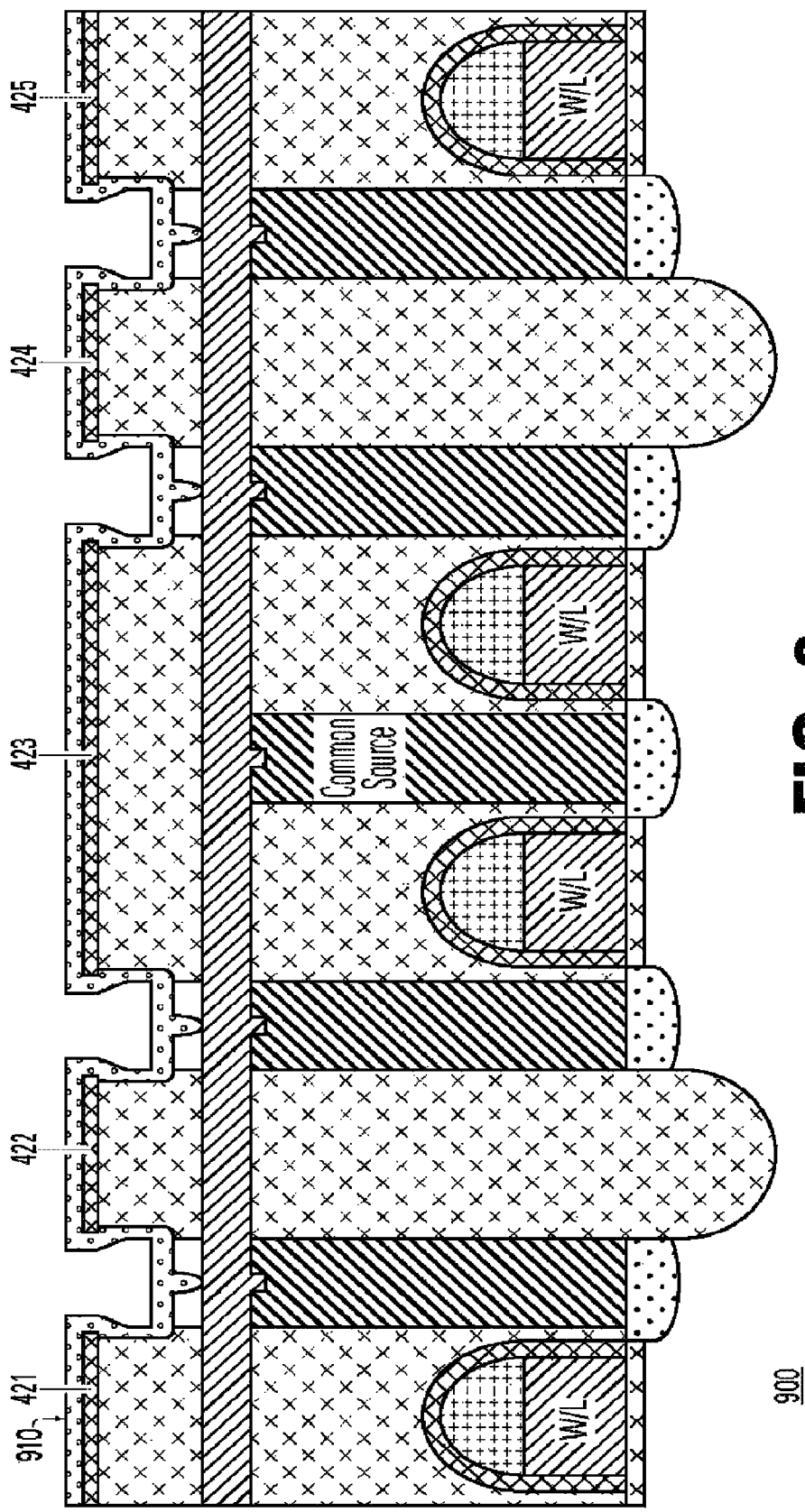
FIG. 9 is a process diagram illustrating a seventh step in carrying out phase change material deposition in accordance with the present invention.

As shown in FIG. 9, there is a cross-sectional view of a process diagram 900 illustrating a seventh step for depositing a thin film layer of the phase change material 910. The thin film layer of phase change material 910 is formed over the top surface of the first segment 421, the second segment 422, the third segment 423, the fourth segment 424 and the fifth segment 425 of the second dielectric layer 420, the vias 510, 512, 514 and 516, and the pores 810, 812, 814 and 816. The phase change material fills the pores and contacts the lower electrode layer 310, and extends along the sidewalls of the vias.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Figure 10:
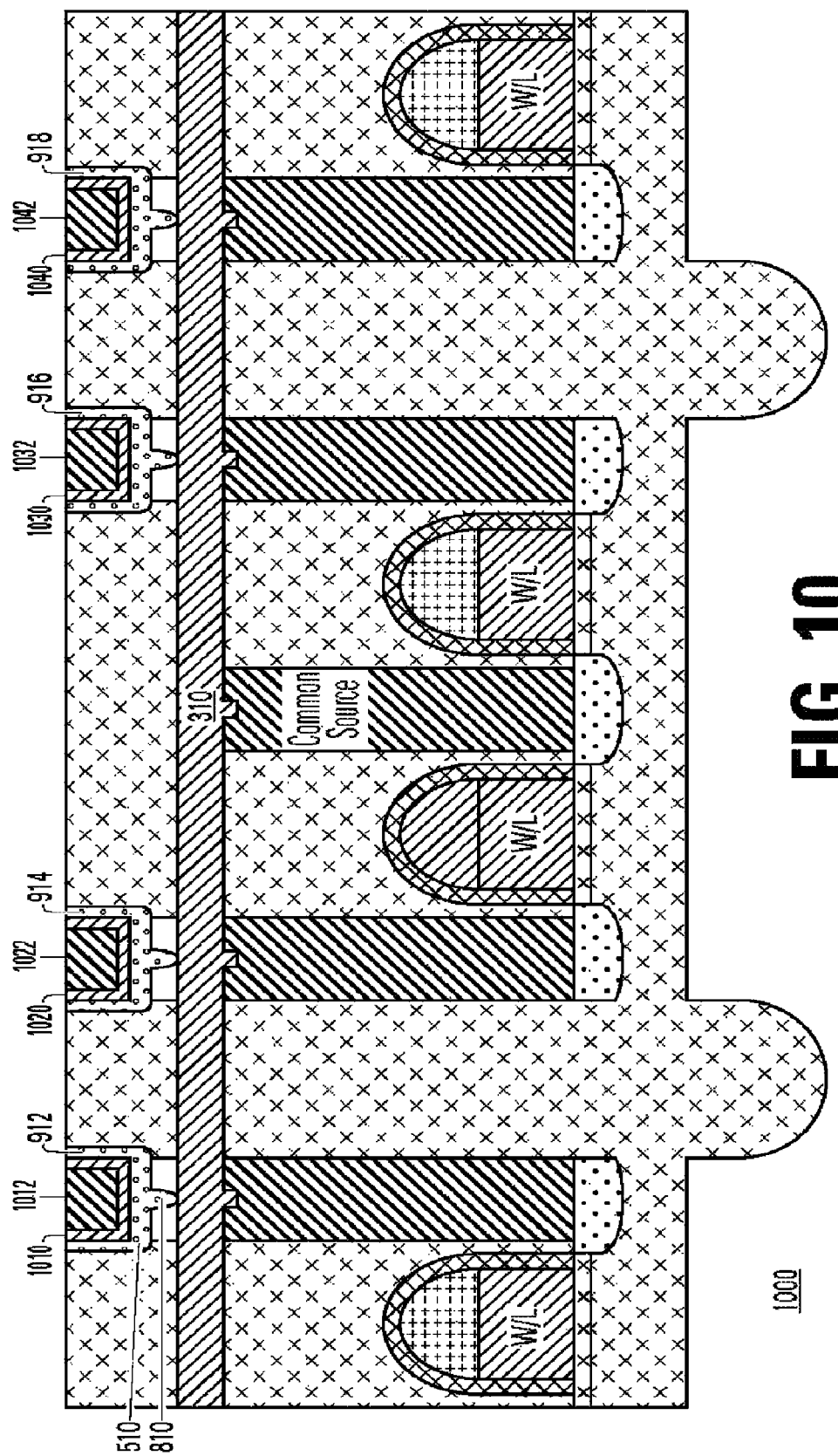
FIG. 10 is a process diagram illustrating an eighth step in performing titanium nitride/tungsten deposition and chemical mechanical polishing in accordance with the present invention.

Referring now to FIG. 10, there is shown cross-sectional view of a process diagram 1000 illustrating an eighth step in titanium nitride and tungsten (W) deposition, and chemical mechanical polishing. The titanium nitride layers 1010, 1020, 1030 and 1040 are deposited, respectively into vias and overlie the phase change material segments 912, 914, 916 and 918. The tungsten layers 1012, 1022, 1032 and 1042 are subsequently overlie the respective one of the titanium nitride layers 1010, 1020, 1030 and 1040. The phase change material 912 electrically coupled between the bottom electrode layer 310 and an upper electrode layer, such as both the titanium nitride layer 1010 and tungsten layer 1012, or either the titanium nitride layer 1010 or tungsten layer 1012. More specifically, a first portion of the phase change material 912 in the via electrically coupled to the bottom electrode layer 310, while a second portion of the phase change material 912 in the via 510 electrically coupled to the upper electrode layer.

Figure 11A:
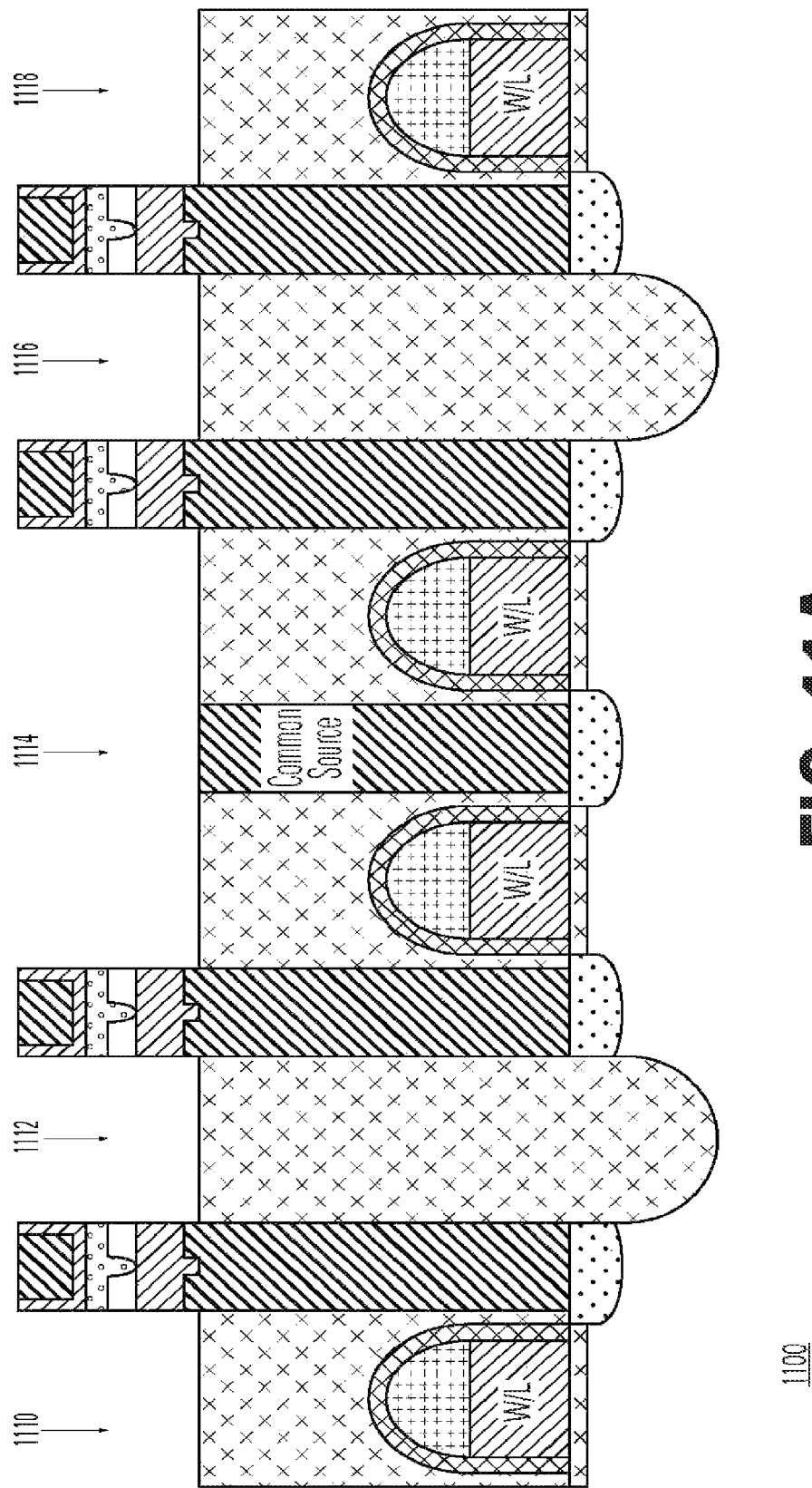
FIG. 11A is a process diagram illustrating a ninth step in carrying out a cell isolation etching in accordance with the present invention.
Figure 11B:
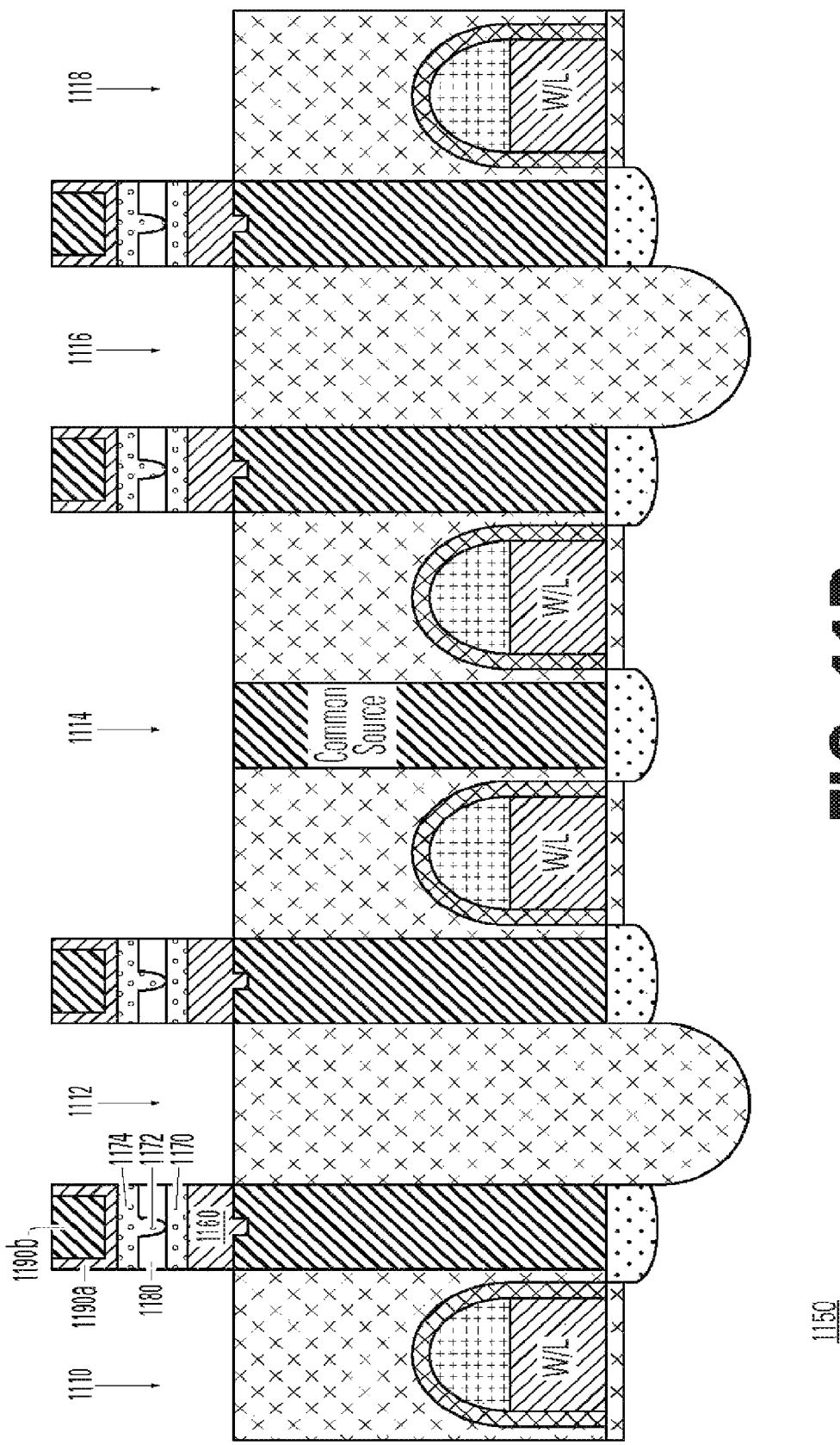
FIG. 11B is a process diagram illustrating an alternative embodiment in the ninth step in carrying out the cell isolation etching in accordance with the present invention.

In FIG. 11A, there is a cross-sectional view of a process diagram 1100 illustrating a ninth step in carrying out cell isolation etching in areas 1110, 1112, 1114, 1116 and 1118. An isolation etching is part of the manufacturing processes that define the cross-sectional area of a chalcogenide memory cell. The width of each chalcogenide memory cell is determined by the isolation etching on each side of a chalcogenide memory cell. In one embodiment of cell isolation etching, the tungsten layer 1012, representing a top electrode, serves as a mask for self-aligning etching of the bottom electrode 310 by fluorine (F) argon (Ar) chemistry. The etching chemistry changes to chlorine (Cl) Ar for etching the TiN in the bottom electrode 310. FIG. 11B is a process diagram illustrating an alternative embodiment in the ninth step in carrying out the cell isolation etching. An active region 1172 of the phase change material is electrically coupled to a top electrode member, represented as titanium nitride 1190a and tungsten 1190b in this embodiment, through a phase change material 1174 that serves as an insulating material between the active region 1172 and the top electrode member 1190a, 1190b. The active region 1172 of the phase change material is electrically coupled to a bottom electrode member 1160 through a phase change material 1170 that serves as an insulating material between the active region 1172 and the bottom electrode member 1160. The top electrode member 1190a, 1190b serves as a mask in self-aligned etching of the bottom electrode member 1160. In another embodiment, the top electrode member refers to the tungsten 1190a while the titanium nitride 1190b serves as an intermediate material. The etch process may be a single anisotropic etch for both a fill and a memory material layer, or a two step process first etching the fill material with a first etch chemistry, and second etching the memory material with a second etch chemistry.

Figure 12:
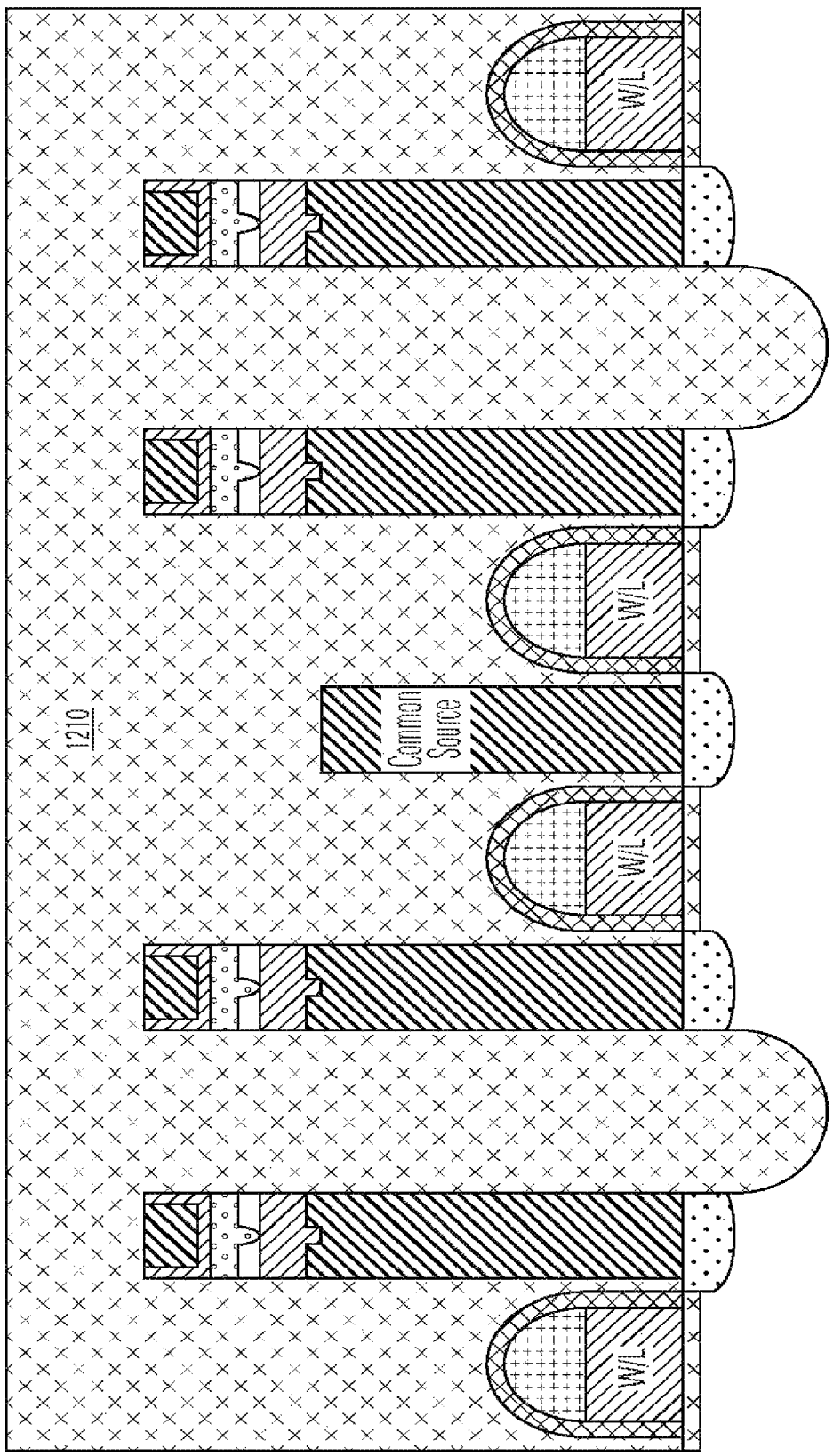
FIG. 12 is a process diagram illustrating a tenth step in conducting an oxide fill-in in accordance with the present invention.

FIG. 12 is a cross-sectional view of a process diagram 1200 illustrating a tenth step in conducting an oxide fill-in. After the isolation etching, an oxide 1210 is used to fill in the trenches in the structure to form isolations in trenches and separate active areas of phase change material from one another.

Figure 13:
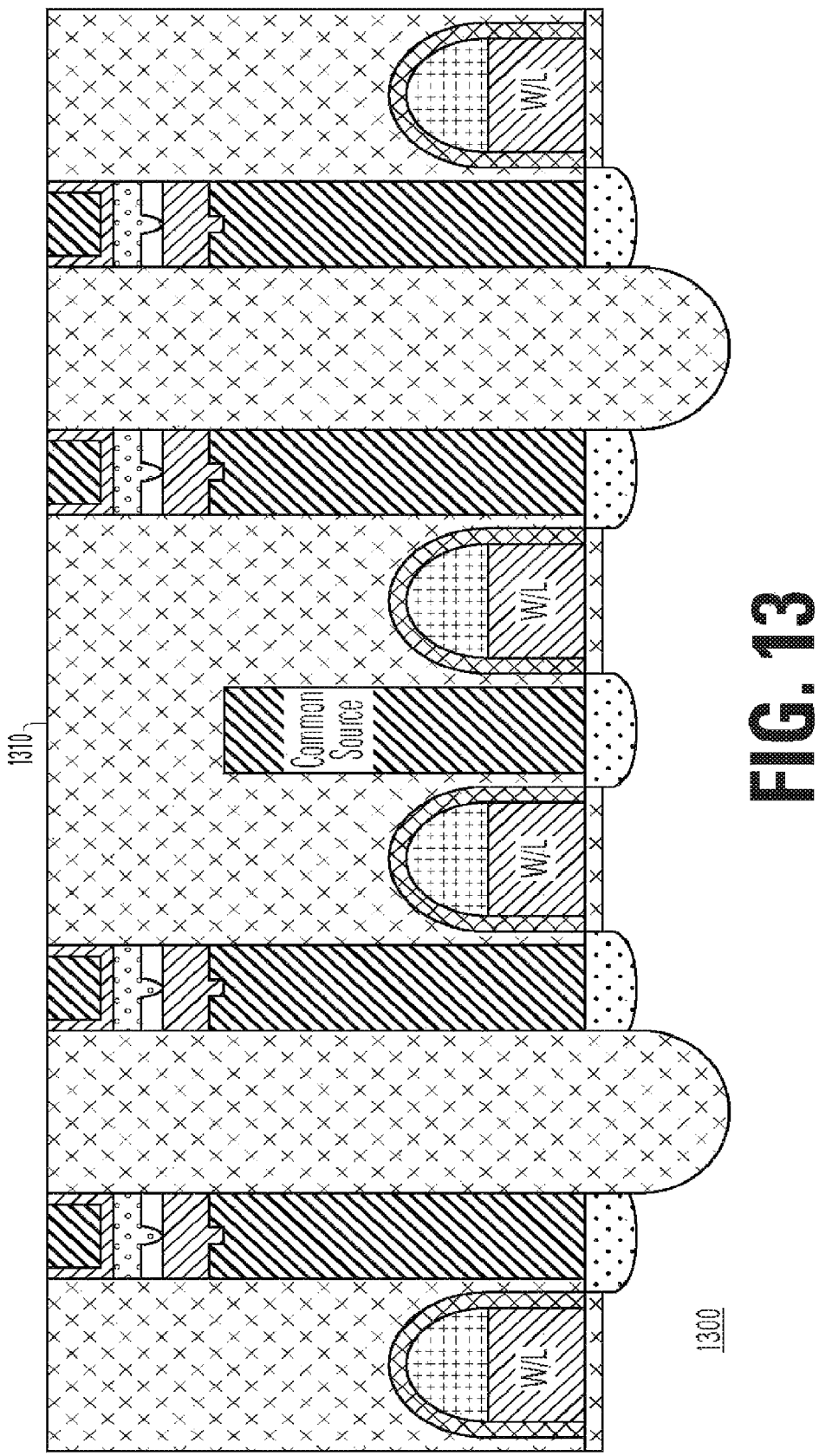
FIG. 13 is a process diagram illustrating an eleventh step in performing oxide chemical mechanical polishing in accordance with the present invention.
Figure 14:
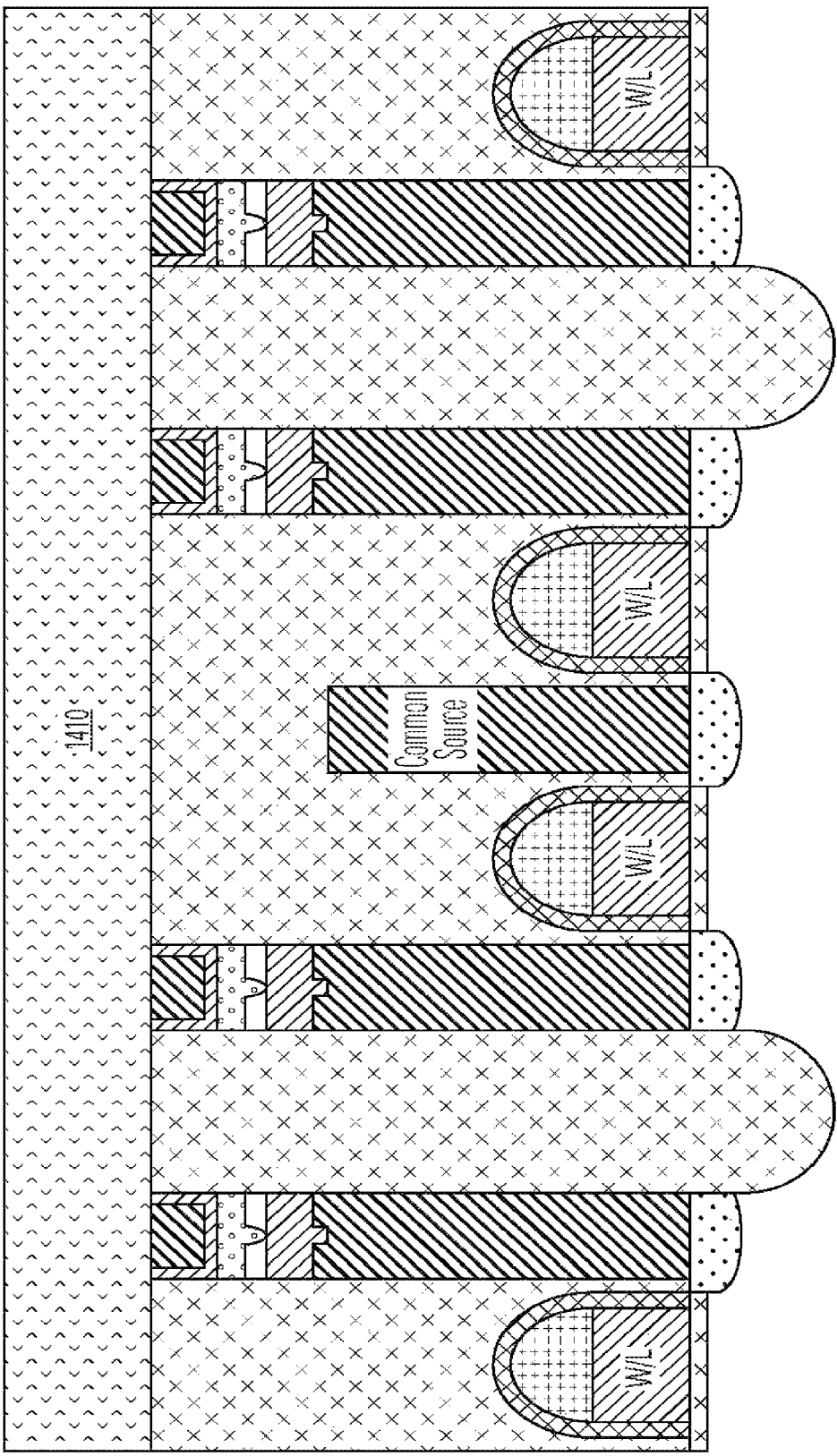
FIG. 14 is a process diagram illustrating a twelfth step in forming a metal bit line in accordance with the present invention.

As illustrated in FIG. 13, there is a cross-sectional view of a process diagram 1300 showing an eleventh step with oxide chemical mechanical polishing. The oxide CMP step is applied to planarize the structure 1300, leaving a substantially planar surface 1310 across the top of the structure 1300. FIG. 14 is cross-sectional view of a process diagram 1400 illustrating a twelfth step in metal bit line formation. After the oxide chemical mechanical polishing, a metal bit line 1410 is formed on the top surface of the structure 1400.

Embodiments of the memory cell include phase change based memory materials, including chalcogenide based materials and other materials, for the memory element. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", *SPIE* v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Other programmable resistive memory materials may be used in other embodiments of the invention, including N2 doped GST, GexSby, Ag doped SbxTey, or other material that uses different crystal phase changes to determine resistance; PrxCayMnO3, PrSrMnO, ZrOx, AlOx, TiOx, NiOx, ZnOx, Cr doped SrZrO3, Nb doped SrZrO3, or other material that uses an electrical pulse to change the resistance state; TCNQ, PCBM, TCNQ-PCBM, Cu-TCNQ, Ag-TCNQ, C60-TCNQ, TCNQ doped with other metal, or any other polymer material that has bistable or multi-stable resistance state controlled by an electrical pulse, For additional information on the manufacture, component materials, use and operation of phase change random access memory devices, see U.S. patent application Ser. No. 11/155,067 entitled "Thin Film Fuse Phase Change RAM and Manufacturing Method", filed on 17 Jun. 2005, owned by the assignee of this application and incorporated by reference as if fully set forth herein.

The invention has been described with reference to specific exemplary embodiments. Various modifications, adaptations, and changes may be made without departing from the spirit and scope of the invention. Accordingly, the specification and drawings are to be regarded as illustrative of the principles of this invention rather than restrictive, the invention is defined by the following appended claims.

I claim:

1. A method for manufacturing a memory device, comprising:
    providing a substrate body having contact plugs, the substrate body having a top surface;
    prior to forming a via, depositing a first electrode layer over the substrate body, the first electrode layer having a top surface;
    forming first and second dielectric layers on the substantially planar surface of the electrode layer, the second dielectric layer overlying the first dielectric layer;
    forming the via at a selected section in which the via extends through the first and second dielectric layers to produce first and second segments in the first and second dielectric layers, the first segment of the second dielectric layer overhanging the first segment of the first dielectric layer, the second segment of the second dielectric layer overhanging the second segment of the first dielectric layer,
    forming a pore in the via exposing the first electrode layer, by forming a sidewall structure within the via, the sidewall structure comprising a low conductivity material;
    depositing a programmable resistive memory material into the pore and contacting the first electrode layer;
    forming a second electrode layer over the programmable resistive memory material within the via, and on sidewalls of the via and patterning the second electrode layer to define a top electrode member in alignment with the via; and
    using the top electrode member as a mask, etching the first and second dielectric layers, and the first electrode layer to define a bottom electrode member aligned with the top electrode member.

2. The method of claim 1, after the forming step of the first electrode layer, further comprises polishing the top surface of the first electrode layer to produce a substantially planar surface on the first electrode layer.

3. The method of claim 2, after the polishing step, wherein the programmable resistive memory material is deposited over the substantially planar surface of the first electrode layer.

4. The method of claim 3, wherein the low conductivity material comprises a low electrical conductivity material having a lower electrical conductivity relative to the programmable resistive memory material.

5. The method of claim 1, wherein the depositing of the programmable resistive memory material step comprises depositing the programmable resistive memory material across the surface of the first and second dielectric layers and into the pore surrounded by the low thermal conductivity material.

6. The method of claim 5, wherein the low conductivity material comprises a low electrical conductivity material having a lower electrical conductivity relative to the programmable resistive memory material.

7. The method according to claim 1, wherein the programmable resistive memory material comprises a phase change material having an amorphous state, and the low conductivity material has a thermal insulation value greater than a thermal insulation value of the phase change material in the amorphous state.

8. The method of claim 1, wherein the low conductivity material comprises a low thermal conductivity material having a lower thermal conductivity relative to surroundings provided by the one or more dielectric layers.

9. The method of claim 1, wherein the first electrode layer comprises an element selected from a group consisting of Ti, W, Mo, Al, Ta, Cu, Pt, Ir, La, Ni, and Ru and alloys thereof.

10. The method of claim 1, wherein the second electrode layer comprises W or TiN.

11. The device of claim 1, wherein the thickness of the first electrode is between about 20 nm and about 60 nm.

12. The method of claim 1, further comprising wet etching the first and second dielectric layers on each side of the via.

13. The method of claim 1, wherein the programmable resistive memory material comprises at least two solid phases including a generally amorphous phase and a generally crystalline phase.

14. The method of claim 1, wherein the memory material comprises an alloy including a combination of two or more materials from the group of Ge, Sb, Te, Se, In, Ti, Ga, Bi, Sn, Cu, Pd, Pb, Ag, S, and Au.

* * * * *